(12) United States Patent
Frazee et al.

(10) Patent No.: US 7,378,721 B2
(45) Date of Patent: May 27, 2008

(54) CHIP ON LEAD FRAME FOR SMALL PACKAGE SPEED SENSOR

(75) Inventors: Lawrence E. Frazee, Freeport, IL (US); Wayne A. Lamb, Freeport, IL (US); John S. Patin, Freeport, IL (US); Peter A. Schelonka, Plymouth, MN (US); Joel D. Stolfus, Freeport, IL (US)

(73) Assignee: Honeywell International Inc., Morristown, NJ (US)

( * ) Notice: Subject to any disclaimer, the term of this patent is extended or adjusted under 35 U.S.C. 154(b) by 172 days.

(21) Appl. No.: 11/295,371

(22) Filed: Dec. 5, 2005

(65) Prior Publication Data

US 2007/0126088 A1  Jun. 7, 2007

(51) Int. Cl.
*H01L 23/495* (2006.01)
*G01P 3/42* (2006.01)

(52) U.S. Cl. .............. 257/666; 257/670; 257/678; 257/787; 257/793; 257/E23.001; 257/E23.007; 257/E23.015; 324/160; 324/161; 324/162; 324/163; 324/164; 324/165

(58) Field of Classification Search ........ 257/666–733, 257/787–796, E23.001–E23.194; 324/160–165
See application file for complete search history.

(56) References Cited

U.S. PATENT DOCUMENTS

| | | | | |
|---|---|---|---|---|
| 4,227,372 | A | 10/1980 | Kakimoto et al. | 60/602 |
| 4,571,945 | A | 2/1986 | Inada et al. | 60/602 |
| 4,771,330 | A * | 9/1988 | Long | 257/672 |
| 5,873,248 | A | 2/1999 | Houtz | 60/602 |
| 5,912,556 | A | 6/1999 | Frazee et al. | |
| 5,974,801 | A | 11/1999 | Houtz | 60/602 |
| 6,034,421 | A * | 3/2000 | Tokunaga | 257/666 |
| 6,067,798 | A | 5/2000 | Okada et al. | 60/602 |
| 6,234,149 | B1 | 5/2001 | Mills et al. | 123/486 |
| 6,378,306 | B2 | 4/2002 | Koelle et al. | 60/605.1 |
| 6,539,714 | B1 | 4/2003 | Wang | 60/598 |
| 6,546,728 | B2 | 4/2003 | Schmidt et al. | 60/602 |
| 6,651,430 | B2 | 11/2003 | Meier et al. | 60/602 |

(Continued)

FOREIGN PATENT DOCUMENTS

EP       0637081 A2    2/1995

(Continued)

*Primary Examiner*—Jasmine J Clark
(74) *Attorney, Agent, or Firm*—Kermit D. Lopez; Luis M. Ortiz

(57) ABSTRACT

A sensor package apparatus includes a lead frame substrate that supports one or more electrical components, which are connected to and located on the lead frame substrate. A plurality of wire bonds are also provided, which electrically connect the electrical components to the lead frame substrate, wherein the lead frame substrate is encapsulated by a thermoset plastic to protect the plurality of wire bonds and at least one electrical component, thereby providing a sensor package apparatus comprising the lead frame substrate, the electrical component(s), and the wire bonds, while eliminating a need for a Printed Circuit Board (PCB) or a ceramic substrate in place of the lead frame substrate as a part of the sensor package apparatus. A conductive epoxy can also be provided for maintaining a connection of the electrical component(s) to the lead frame substrate. The electrical components can constitute, for example, an IC chip and/or a sensing element (e.g., a magnetoresistive component) or sense die.

19 Claims, 7 Drawing Sheets

U.S. PATENT DOCUMENTS

| | | | |
|---|---|---|---|
| 6,871,499 B1 | 3/2005 | Allen et al. | 60/608 |
| 6,880,337 B2 | 4/2005 | Masuda | 60/608 |
| 6,880,518 B2 | 4/2005 | Shiraishi et al. | 123/295 |
| 6,886,337 B2 | 5/2005 | Friedrich et al. | 60/614 |
| 2005/0017709 A1 | 1/2005 | Stolfus et al. | 324/174 |

FOREIGN PATENT DOCUMENTS

| | | |
|---|---|---|
| JP | 2005030941 | 2/2005 |
| JP | 2005331296 | 12/2005 |

* cited by examiner

CHIP ON LEAD FRAME FOR SMALL PACKAGE SPEED SENSOR

TECHNICAL FIELD

Embodiments are generally related to sensing devices and methods. Embodiments also relate to speed sensors. Embodiments additionally relate to turbochargers utilized in automotive systems.

BACKGROUND OF THE INVENTION

Turbochargers are utilized in engines for improving the output power of the engine by increasing the airflow charge to the cylinders to support an increased fuel charge. Turbochargers are well known devices for pressurizing intake air entering the combustion chambers of an internal combustion engine to thereby increase the efficiency and power output of the engine. In general, pressurizing the intake air increases the quantity of air entering the engine cylinders during the intake stroke, and this allows more fuel to be utilized in establishing a desired air-to-fuel ratio. Increased available engine output torque and power is thereby realized.

In a turbocharged engine, the exhaust manifold of the engine is fluidly coupled to a turbine component of the turbocharger via an exhaust conduit, and the exhaust gas flowing through the exhaust conduit causes a turbine wheel within the turbine to rotate at a rate determined by the pressure and flow rate of exhaust gas. A compressor wheel within a compressor component of the turbocharger is mechanically coupled to the turbine wheel, and is therefore rotatably driven by the turbine wheel. An inlet of the compressor receives fresh ambient air, and an outlet of the compressor is fluidly coupled to the intake manifold of the engine via an intake conduit. The rotatably driven action of the compressor wheel increases the amount of intake air supplied to the intake conduit, thereby resulting in an increased, or so-called "boost", pressure therein.

With the development of increasingly sophisticated turbocharger and related automotive components, a need has arisen for extremely small package designs for turbocharger speed sensors utilized, for example, in diesel and gasoline engines. Current turbocharger speed sensors are used chiefly in laboratory settings or in a very limited basis at the center of a turbocharger housing. Locating the speed sensor instead on the compressor housing of the turbocharger takes advantage of cooler temperatures for sensor operations. The compressor housing location means that the sensor detects the speed of the compressor wheel as it spins at high RPM in the turbocharger. Such an arrangement also means that a hole or sensor bore through the compressor housing is required for the sensor face to be in close proximity to the fins of the compressor wheel.

Because the compressor wheel and compressor housing have been machined to close precision and the compressor wheel has been properly balanced, the added sensor bore and sensor must provide for a minimal operational impact. To prevent as little disruption as possible to the compressor wheel spinning at high RPM and to the airflow in the compressor housing, the speed sensor package should be configured in as compact and small an arrangement as possible. A small speed sensor package is also desirable for mounting or installation of the sensor on smaller sized turbochargers.

The cooler temperatures of approximately 190° C. on the compressor side of the turbocharger allow all of the integrated circuits (IC's) and signal conditioning electronics to be packaged together and over-molded with a thermoplastic into a single package with an integral connector. Such a configuration eliminates the need for a pigtail or wire harness version of the sensor to remotely locate associated electrical components. A single integrated package can therefore reduce the number of components needed along with the associated material costs and manufacturing processes that would otherwise be required in a pigtail version. An integral connector version can thus allow for an enhanced sealing capability by eliminating multiple interconnects that would be necessary in a pigtail version.

In prior art sensor packages, the sense die is typically encapsulated in a thermoset package with external leads. The resulting IC package is then placed on a substrate such as a PCB or ceramic, along with other electronics. The substrate is then attached to a plastic carrier of some sort, encapsulated with thermoset for protection and then over-molded again with a thermoplastic to provide the final sensor package with integral connectors. A need exists for a sensor package and apparatus, which would allow for a much smaller sensor package than that afforded by conventional sensor packaging techniques and devices. It is believed that the sensor packaging methodology and devices described herein address this continuing need.

BRIEF SUMMARY

The following summary is provided to facilitate an understanding of some of the innovative features unique to the embodiments disclosed and is not intended to be a full description. A full appreciation of the various aspects of the embodiments can be gained by taking the entire specification, claims, drawings, and abstract as a whole.

It is, therefore, one aspect of the present invention to provide for an improved sensor.

It is another aspect of the present invention to provide for an improved speed sensor package.

It is a further aspect of the present invention to provide for an improved turbochargers speed sensor and packaging apparatus thereof.

The aforementioned aspects and other objectives and advantages can now be achieved as described herein. A sensor package apparatus and method are disclosed, including a lead frame substrate that supports one or more electrical components. Such electrical components are generally connected to and located on the lead frame substrate. A plurality of wire bonds are also provided, which electrically connect the electrical components to the lead frame substrate, wherein the lead frame substrate is encapsulated by a thermoset plastic to protect the plurality of wire bonds and at least one electrical component, thereby providing a sensor package apparatus comprising the lead frame substrate, the electrical component(s), and the wire bonds, while eliminating a need for a Printed Circuit Board (PCB) or a ceramic substrate in place of the lead frame substrate as a part of the sensor package apparatus. A conductive epoxy can also be provided for maintaining a connection of the electrical component(s) to the lead frame substrate. The lead frame substrate encapsulated by the thermoplastic comprises a thermoset plastic carrier for constructing the sensor package apparatus. The electrical components can constitute, for example, an IC chip and/or a sensing element (e.g., a magnetoresistive component) or sense die.

BRIEF DESCRIPTION OF THE DRAWINGS

The accompanying figures, in which like reference numerals refer to identical or functionally-similar elements throughout the separate views and which are incorporated in and form a part of the specification, further illustrate the embodiments and, together with the detailed description, serve to explain the embodiments disclosed herein.

DETAILED DESCRIPTION

The particular values and configurations discussed in these non-limiting examples can be varied and are cited merely to illustrate at least one embodiment and are not intended to limit the scope thereof.

Figures 1A, 1B:
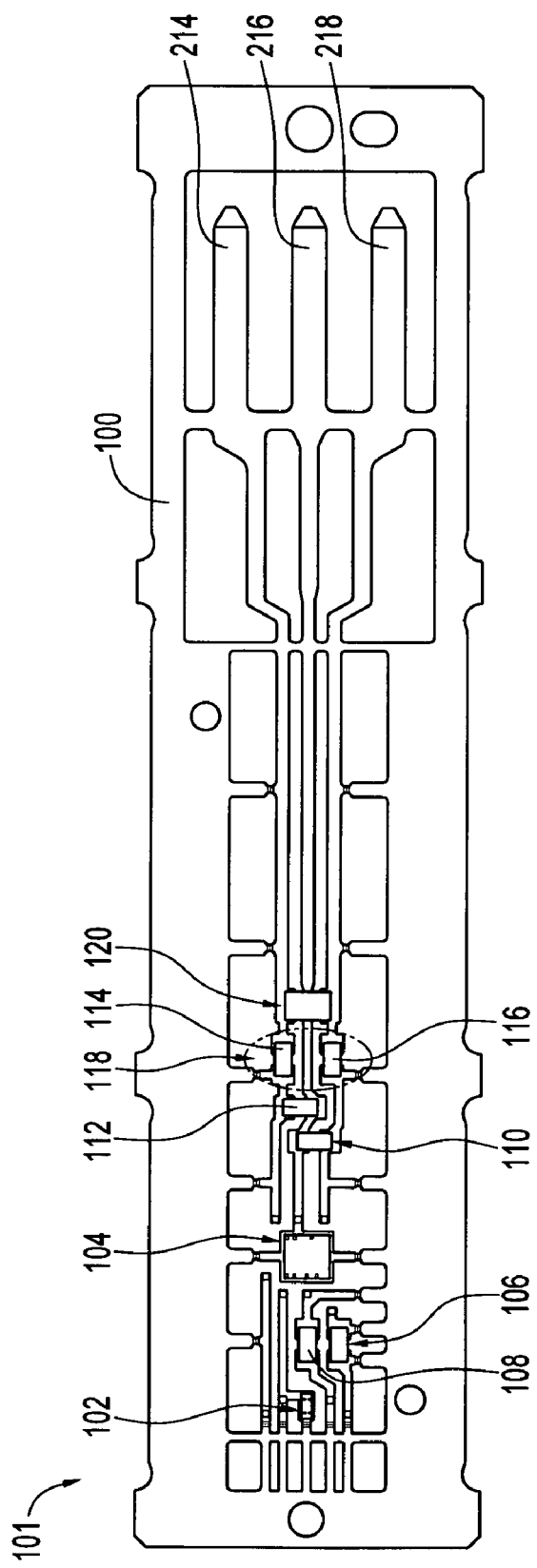
FIGS. 1A and 1B illustrate respective top and side views of a lead frame configuration, which can be implemented in accordance with an embodiment.

FIGS. 1A and 1B illustrate respective top and side views 101 and 103 of a lead frame substrate 100, which can be implemented in accordance with one embodiment. Note that in side views 101 and 103 of lead frame substrate 100 identical or similar parts or elements are generally indicated by identical reference numerals. Lead frame substrate 100 can thus be utilized to maintain, for example, an integrated circuit (IC) chip 104 and/or a magnetoresistive element 102 (e.g., a GMR or AMR transducer) along with coupling capacitors 106 and 108. The magnetoresistive element 102 can constitute, for example, a sensing element or sense die. The IC chip can be maintained by the lead frame substrate 100 in addition to a plurality 118 of beads 114 and 116. The chip 102 can be implemented as, for example, an ASIC. One or more filtering capacitors 110 and 112 can also be maintained by lead frame substrate 100. Additionally, a plurality of lead frame terminals 214, 216 and 218 are featured, which are configured from lead frame substrate 100. The foregoing components and lead frame substrate 100 can be implemented in the context of a speed sensor utilized in association with a turbocharger.

Figure 2:
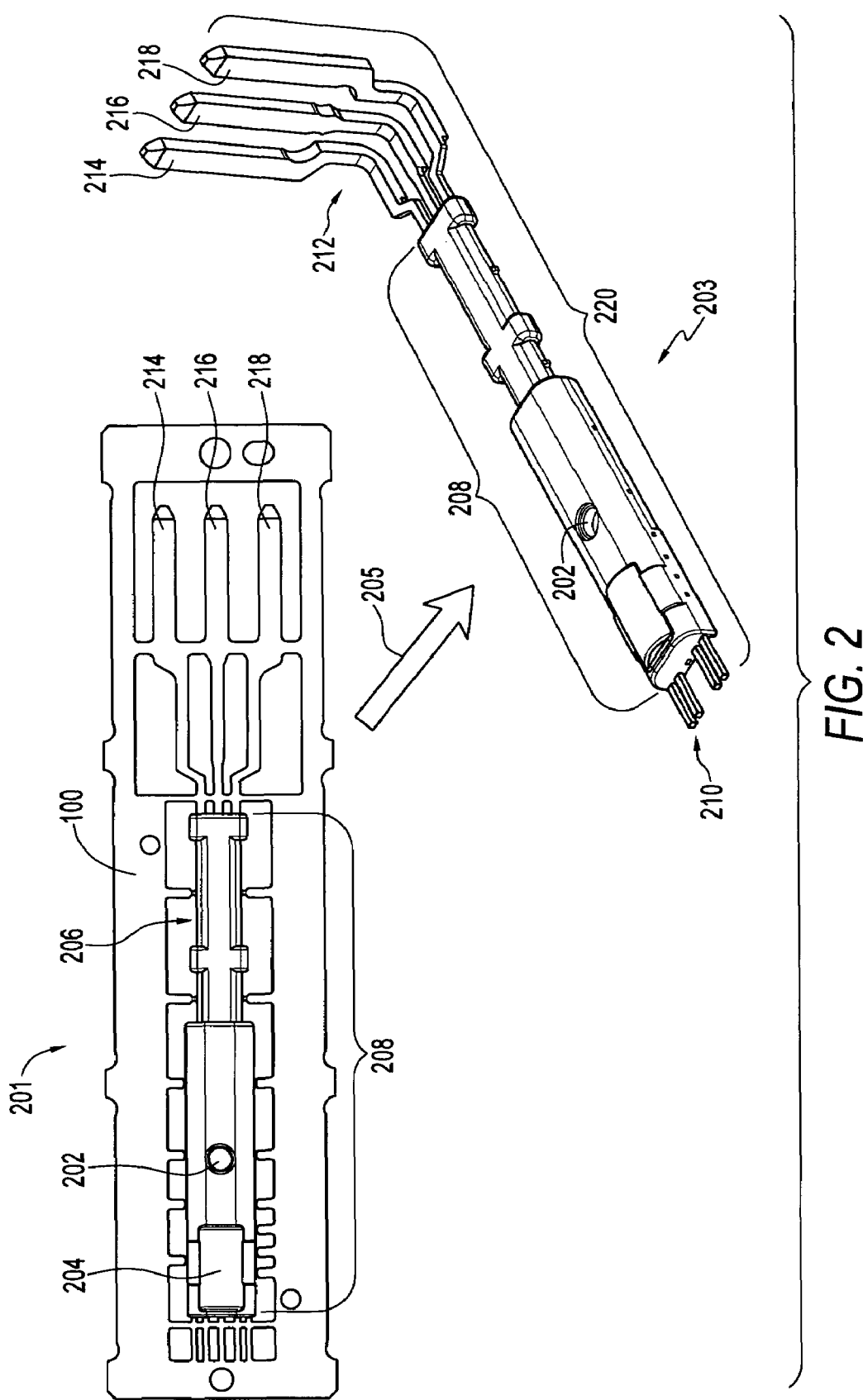
FIG. 2 illustrates a perspective view of a thermoset packaging arrangement, which can be implemented in accordance with an embodiment.

FIG. 2 illustrates respective "before" and "after" perspective views 201 and 203 of a thermoset sensor package apparatus 220, which can be implemented in accordance with an embodiment. Note that in views 201 and 203, identical or similar parts or elements are indicated generally by identical reference numerals. Additionally, in FIGS. 1-2 identical or similar parts or elements are also indicated by identical reference numerals. In the "before" view 201, the lead frame substrate 100 maintains a speed sensor housing 208, which includes plastic ribs 206, along with a location pin 202 that is utilized for thermoplastic over-molding.

A protruded portion 204 can also be provided by speed sensor housing 208 within which a magnet may be maintained relative to the sensing element or sense die 102 and/or the IC chip 104. Arrow 205 illustrated in FIG. 2 indicates the transition from the "before" view 201 to the "after" view 203. As depicted in the "after view" a plurality of terminals 210 protrude from speed sensor housing 208, while a tie bar 212 can be formed that includes terminals 214, 216 and 218. The formation of tie bar 212 can be based on a 90-degree bending configuration, again depending upon design considerations. In general, the aforementioned components along with speed sensor housing 208 form a speed sensor package apparatus 220.

Figure 3:
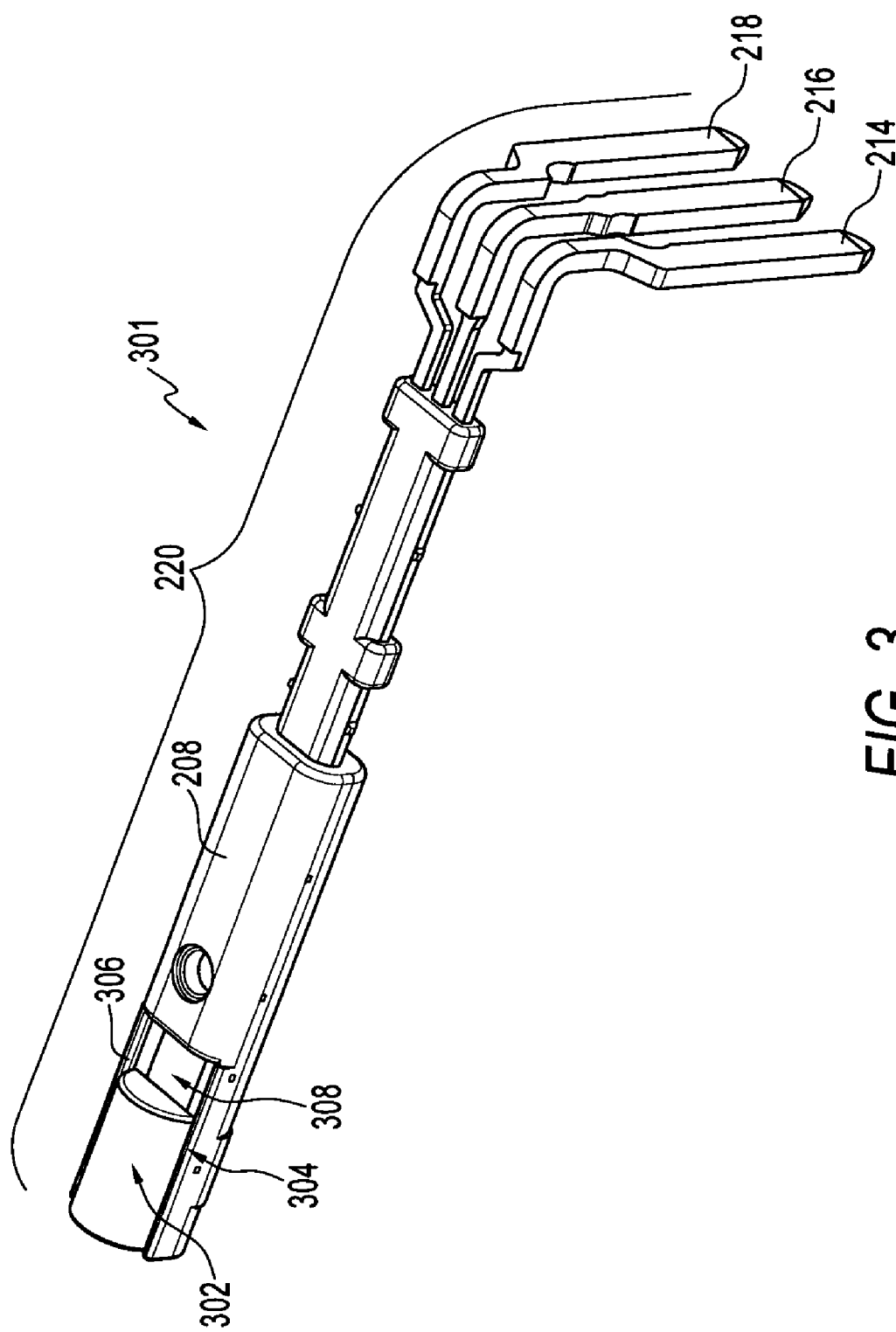
FIG. 3 illustrates a bottom perspective view of the speed sensor package apparatus, including a magnet, in accordance with an embodiment.

FIG. 3 illustrates a bottom perspective view 301 of the speed sensor package apparatus 220, including a magnet 302, in accordance with an embodiment. Note that in FIGS. 1-3, identical or similar parts or elements are generally indicated by identical reference numerals. In some embodiments, the magnet 302 can be calibrated for orientation and placement in association with the speed sensor housing 20 of the sensor package apparatus 220. Magnet 302 can be moved until a desired magnetoresistive bridge circuit output is obtained. Plastic rails 304 and 306 can be integrated with the speed sensor housing 208 in order to restrict the movement of magnet 302 perpendicular to the sensor formed from sensor housing 208. The speed sensor package apparatus 220 can essentially the speed sensor housing 208 and the lead frame terminals 214, 216, and 218. The magnet 302 can be bonded to a thermoset channel 308, which is bounded by rails 304 and 306 and configured from the sensor housing 208.

Figure 4:
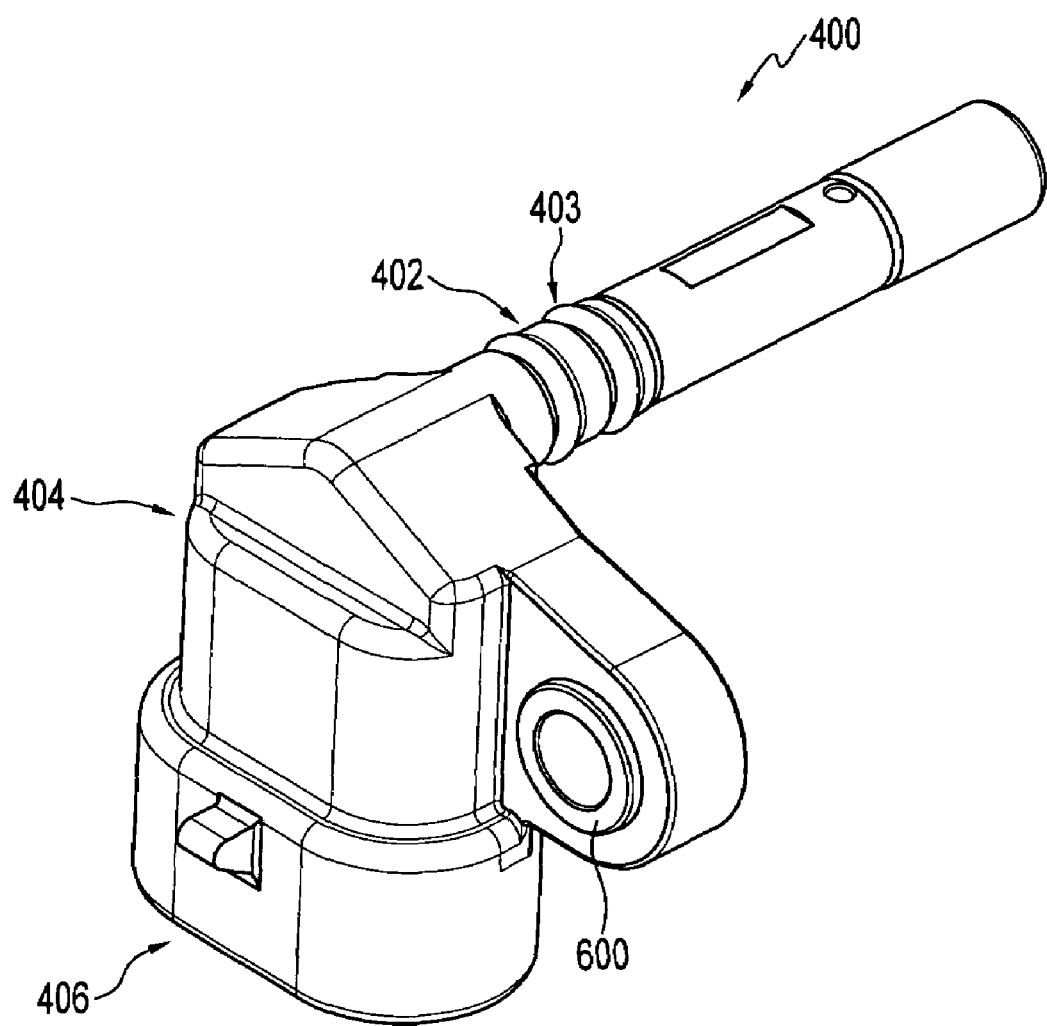
FIG. 4 illustrates a perspective view of a second level over-mold 400, which can be implemented for maintaining the turbocharger speed sensor package apparatus in accordance with an embodiment.

FIG. 4 illustrates a perspective view of a second level over-mold 400, which can be implemented for maintaining the turbocharger speed sensor package apparatus 220 in accordance with an embodiment. Note that in FIGS. 1-4, identical or similar parts or elements are generally indicated by identical reference numerals. The over-mold 200 can be implemented with one or more O-rings 403 and a thermoplastic component 404. A connecting mechanism or component 406 can also be provided in association with a machined bushing 600, which is shown in greater detail herein with respect to FIG. 6. The second level over-mold depicted in FIG. 4 generally surrounds and encases the sensor package apparatus 220 depicted previously herein with respect to FIGS. 1-3. Over-mold 400 thus forms the general outlines of an enhanced speed sensor thereof, which is maintained within and by over-mold 400. Thus, reference numeral 400 depicted in FIG. 4 can be utilized not only to refer the over-mold thereof but also to the speed sensor, which can incorporate the sensor package apparatus 220 described earlier.

Figure 6:
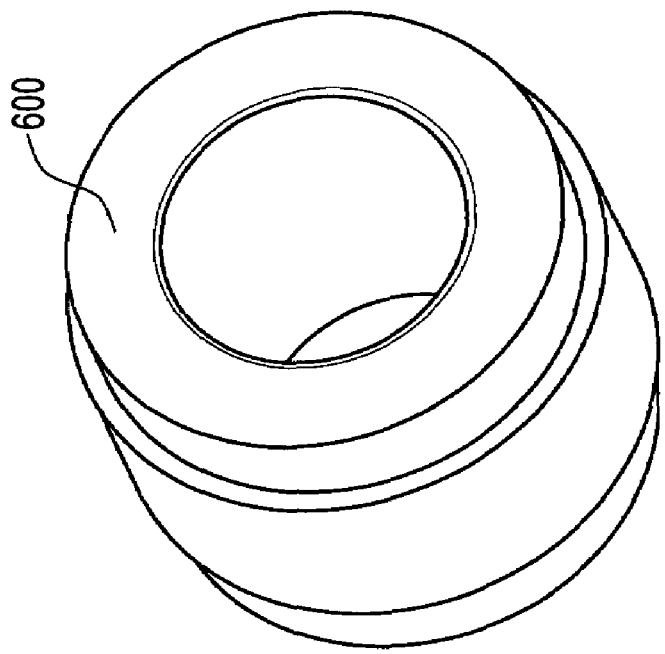
FIG. 6 illustrates the machined bushing, which can be implemented in accordance with the embodiment of FIG. 4.
Figure 5:
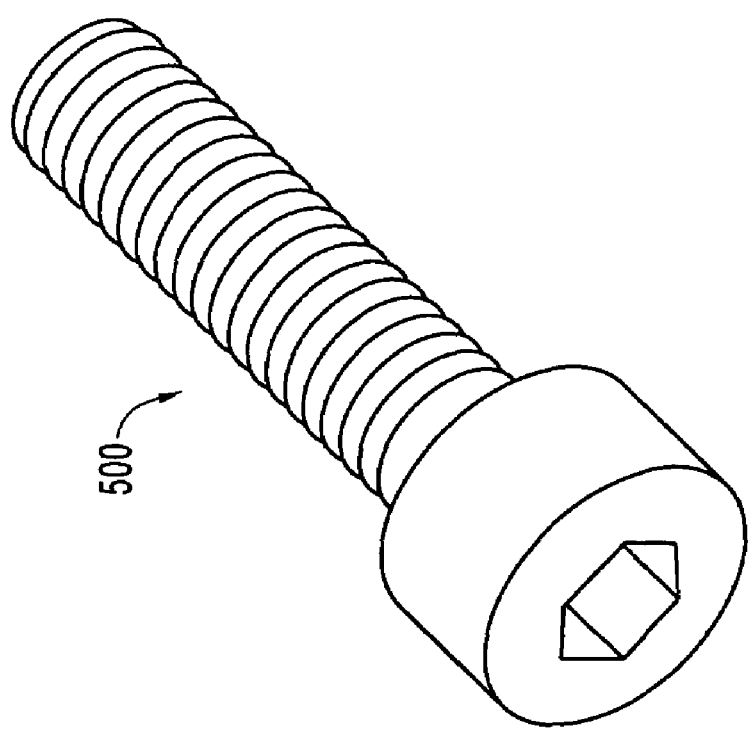
FIG. 5 illustrates a mounting bolt, which can be implemented in accordance with the embodiment depicted in FIG. 4.
Figure 7:
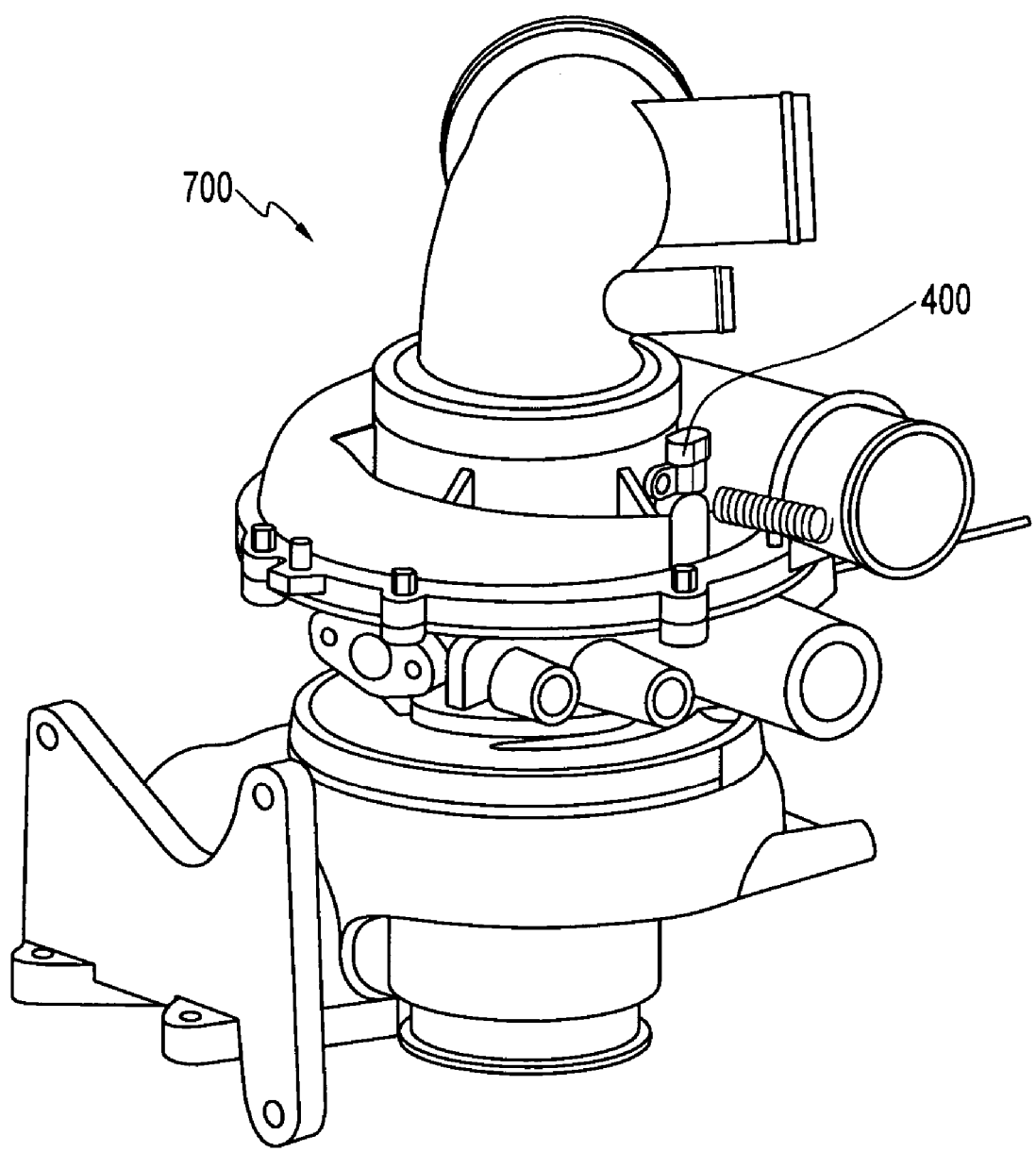
FIG. 7 illustrates a perspective view of sensor installed in a turbocharger, in accordance with an embodiment.

FIG. 5 illustrates a mounting bolt 500, which can be implemented in accordance the embodiment depicted in FIG. 4. Similarly, FIG. 6 illustrates the machined bushing 600, which can be implemented in accordance with the embodiment of FIG. 4. The mounting bolt 500 can be provided with a thread lock feature, while the machined bushing 500 can be configured from brass, depending upon design considerations. FIG. 7 illustrates a perspective view of sensor 400 installed in a turbocharger 700, in accordance with an embodiment.

Note that the size, orientation and position of magnet 302 are important for the small sensor construction and performance required for turbocharger speed sensor applications. Due to the limited space and packaging constraints, a half cylinder shaped magnet can be utilized for magnet 302, which can fit within a small diameter and provide as much surface area as possible for signal strength. The magnetoresistive (MR) sensing element 102 depicted in FIGS. 1A-1B, for example, is generally sensitive to magnet 302 movement in two planes. Therefore, to achieve an optimal signal strength, the calibration procedure described herein can be accomplished in order to place the magnet 302 in a "sweet" spot for maximum sensor performance. Magnet 302 can be attached to the speed sensor housing 208 (i.e., a thermoset package), which contains the MR sensing element 102 by using a UV curable epoxy until final package over-molding occurs.

In order to the find the so-called "sweet" spot for optimal performance, a mapping procedure can be accomplished, which very accurately locates the magnet 302 relative to the MR sensing element 102. The magnet 302 and mating thermoset package (e.g., sensor housing 208) can then be fixed in place and the magnet 302 moved away from the thermoset package and the magnet 302 moved very accurately in two planes using, for example a mapping device with stepper motor controls. The mapping can be accomplished with the magnet 302 containing the full potential travel of the magnet 302 on the sensor housing 208 or thermoset package thereof.

Resulting data can then be analyzed to determine the optimal "sweet" spot. The magnet 302 can then be moved away from the sensor housing 208 or thermoset package and a drop of UV curable epoxy placed on the thermoset package. The magnet 302 can then be moved back to the thermoset package, displacing the epoxy and creating a thin layer of epoxy between the magnet 302 and the thermoset package or housing 208. A UV light can then be utilized to temporarily lock the magnet in place. A batch cure, for example, can later be utilized to final cure the epoxy prior to thermoplastic over-molding.

Figure 8:
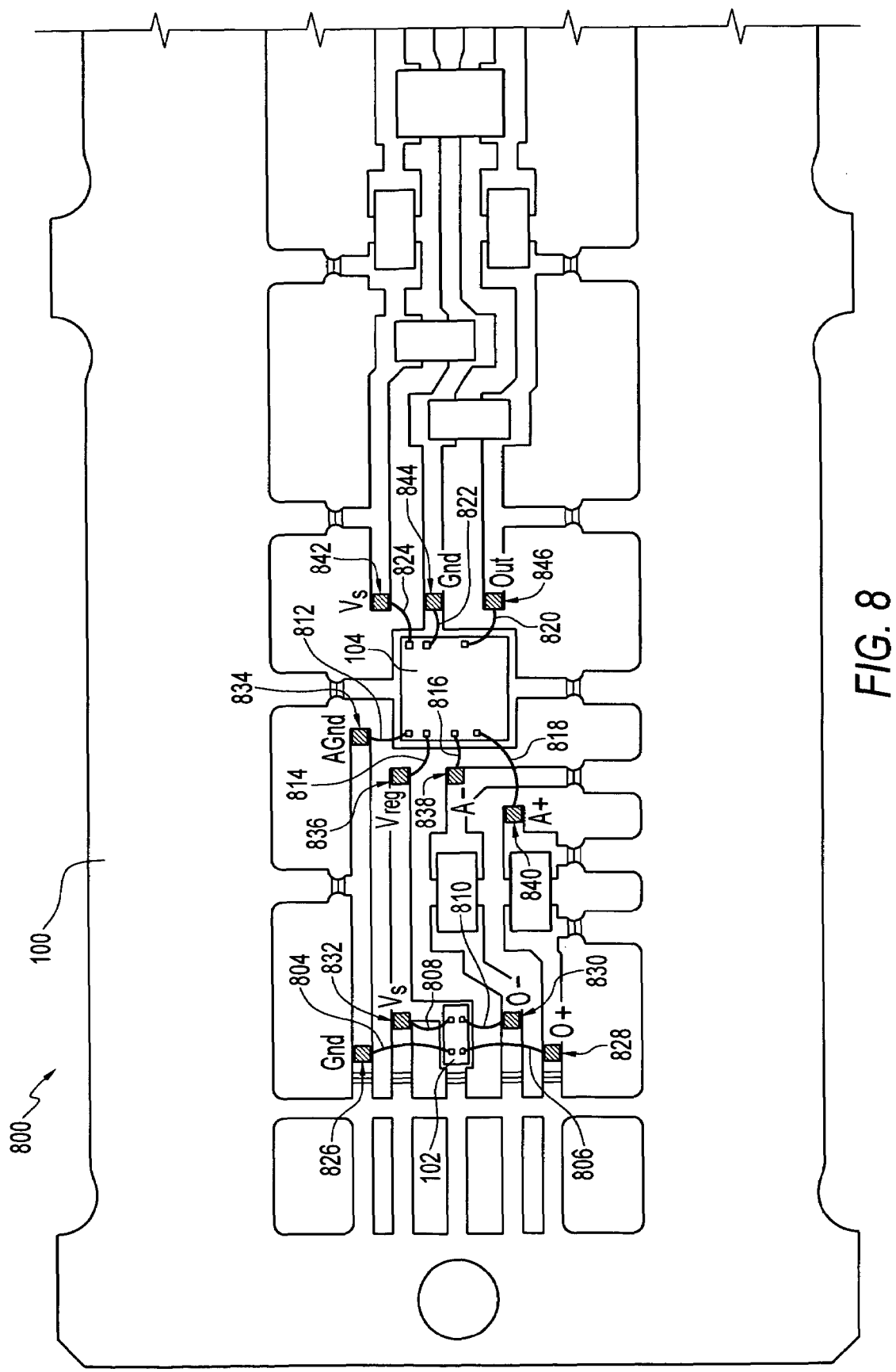
FIG. 8 illustrates a detailed view of a section of the sensor package apparatus and the lead frame substrate thereof, in accordance with a preferred embodiment.

FIG. 8 illustrates a detailed view of a section 800 of the sensor package apparatus 220 and the lead frame substrate 100 thereof, in accordance with a preferred embodiment. Note that in FIGS. 1-8, identical or similar parts or elements are generally indicated by identical reference numerals. In general, the sense die 102 and/or IC chip 104 can be held in place on the lead frame substrate 100 using a conductive epoxy between the sense die 102 and/or the IC chip 104 and the lead frame substrate 100. Similarly, the magnetoresistive component 102 can also be held in place on the lead frame substrate 100 using such a conductive epoxy, depending on design considerations. A plurality of wire bonds 804, 806, 808, 810 electrically connect the component or sense die 102 to lead frame substrate 100 at respective connectors 826, 828, 830, 832. Similarly, a plurality of wire bonds 812, 814, 816, 818, 820, 822, and 824 electrically connect the IC chip 104 and to the lead frame substrate 100 at respective connectors, 834, 836, 838, 840, 842, 844, and 842.

Thus, the lead frame substrate 100 supports a plurality of electrical components, such as, for example, sense die 102 and/or IC chip 104. The IC chip 104 and/or sense die 102 can be connected to and located on the lead frame substrate 100. The wire bonds 812, 814, 816, 818, 820, 822, and 824 and/or 804, 806, 808, 810 electrically connect, respectively, the IC chip 104 and/or magnetoresistive component 102 to the lead frame substrate 100, wherein the lead frame substrate 100 is encapsulated by a thermoset plastic to protect the wire bonds 812, 814, 816, 818, 820, 822, and 824 and/or 804, 806, 808, 810 and the electrical components 102, 104, thereby forming the sensor package apparatus 220 described earlier, and eliminating a need for a Printed Circuit Board (PCB) or a ceramic substrate in place of the lead frame substrate 100 as a part of the sensor package apparatus 220.

All signal conditioning electronic components can be placed on the same lead frame substrate 100 in a similar manner, thereby eliminating the need for a PCB (Printed Circuit Board) or a ceramic substrate. The lead frame substrate 100, which now carries all IC's and electrical components, can then be encapsulated by a thermoset plastic as described earlier to build up the final packaged sensor 220.

A number of advantages can result from implementing the embodiments discussed herein. For example the cooler temperatures of approximately 190° C., for example, on the compressor housing side of the turbocharger allow all of the integrated circuits (IC's) and signal-conditioning electronics to be packaged together and over-molded with a thermoplastic into a single package with integral connectors. This eliminates the need for a so-called "pigtail" or wire-harness version of the sensor to remotely locate the electrical components. A single integrated package as described herein can therefore reduce the number of components required along with associated material costs and manufacturing processes that may be needed in a "pigtail" version. The use of an integral connector, for example, allows for enhanced sealing by eliminating multiple interconnects that are utilized in conventional "pigtail" versions.

As provided by the apparatus and methodology disclosed herein, a much smaller package size can be accomplished by placing the sensing element 102 and/or IC chip 104 directly on the lead frame substrate 100. All other signal conditioning electronic components, for example, can be placed on the same lead frame substrate 100 in the same manner, thereby eliminating the need for a PCB or ceramic substrate. This also eliminates the need for an additional thickness of encapsulation over the electronics, thereby providing a smaller package size. Note that the same chip on lead frame methodology as adapted for use in configuring a turbocharger speed sensor can also be utilized in a number of other sensor applications to reduce components and allow for small package sizes.

It will be appreciated that variations of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims.

What is claimed is:

1. A speed sensor package apparatus, comprising:
   a lead frame substrate that supports at least one electrical component, wherein said at least one electrical component is connected to and located on said lead frame substrate;
   a plurality of wire bonds, which electrically connect said at least one electrical component to said lead frame substrate, wherein said lead frame substrate is encapsulated by a thermoset plastic to protect said plurality of wire bonds and said at least one electrical component;
   a conductive epoxy for maintaining a connection of said at least one electrical component to said lead frame substrate; and
   a housing for maintaining said lead frame substrate, said at least one electrical component, said plurality of wire bonds, said thermoset plastic and said conductive epoxy, thereby providing a sensor package apparatus for maintaining a speed sensor, said sensor package apparatus comprising said lead frame substrate, said at least one electrical component, and said plurality of wire bonds, while eliminating a need for a Printed Circuit Board (PCB) or a ceramic substrate in place of said lead frame substrate as a part of said sensor package apparatus.

2. The apparatus of claim 1 wherein said at least one electrical component comprises at least one sense die, wherein said at least one sense die is held in place on said lead frame substrate by said conductive epoxy, which is located between said at least one sense die and said lead frame substrate.

3. The apparatus of claim 1 wherein said lead frame substrate encapsulated by said thermoplastic comprises a thermoset plastic carrier for constructing said speed sensor package apparatus.

4. The apparatus of claim 3 wherein said at least one electrical component comprises an IC chip.

5. The apparatus of claim 4 wherein said IC chip comprises an ASIC.

6. The apparatus of claim 1 wherein said at least one electrical component comprises a sense die and an IC chip.

7. The apparatus of claim 1 wherein said at least one electrical component comprises a magnetoresistive component.

8. The apparatus of claim 1 further comprising:
a plurality of terminals that protrude from a first end of said housing; and
a tie bar that protrudes from a second end of said housing, wherein said tie bar includes a plurality of other terminals.

9. The apparatus of claim 1 wherein said speed sensor comprises a turbocharger speed sensor.

10. A speed sensor package apparatus, comprising:
a lead frame substrate that supports at least one electrical component, wherein said at least one electrical component is connected to and located on said lead frame substrate;
a plurality of wire bonds, which electrically connect said at least one electrical component to said lead frame substrate and a conductive epoxy for maintaining a connection of said at least one electrical component to said lead frame substrate, wherein said lead frame substrate is encapsulated by a thermoset plastic to protect said plurality of wire bonds and said at least one electrical component; and
a speed sensor housing surrounding said lead frame substrate, said at least one electrical component, said plurality of wire bonds, said conductive epoxy and said thermoset plastic, wherein said speed sensor housing is maintained by said lead frame substrate, thereby providing a speed sensor package apparatus for maintaining said speed sensor, said speed sensor package apparatus comprising said speed sensor housing, said lead frame substrate, said at least one electrical component, and said plurality of wire bonds, while eliminating a need for a PCB or a ceramic substrate in place of said lead frame substrate as a part of said speed sensor package apparatus.

11. The apparatus of claim 10 wherein said at least one electrical component comprises an IC chip.

12. The apparatus of claim 11 wherein said IC chip comprises an ASIC.

13. The apparatus of claim 10 wherein said at least one electrical component comprises a sense die.

14. The apparatus of claim 10 wherein said at least one electrical component comprises a magnetoresistive sensing element and a magnet that is located relative to said magnetoresistive sensing element for optimal performance utilizing a mapping procedure that very accurately locates said magnet relative to said magnetoresistive sensing element.

15. The apparatus of claim 10 wherein said magnet comprises a half cylinder shaped magnet which is capable of fitting within a small diameter and provide as much surface as possible for optimal signal strength thereof.

16. The apparatus of claim 10 wherein said magnetoresistive sensing element is sensitive to a movement of said magnet with respect to two planes.

17. The apparatus of claim 10 further comprising a plurality of plastic rails integrated with said speed sensor housing that restrict a movement of said magnet perpendicular to said speed sensor formed from said speed sensor housing.

18. The apparatus of claim 17 further comprising a thermoset channel formed between and bounded said plastic rails and configured from said speed sensor housing.

19. A speed sensor package apparatus, comprising:
a lead frame substrate that supports at least one electrical component, wherein said at least one electrical component is connected to and located on said lead frame substrate; said at least one electrical component comprising at least one magnetoresistive at least one magnetoresistive sensing element and at least one magnet that is located relative to said magnetoresistive sensing element for optimal performance thereof;
a plurality of wire bonds, which electrically connect said at least one electrical component to said lead frame substrate, wherein said lead frame substrate is encapsulated by a thermoset plastic to protect said plurality of wire bonds and said at least one electrical component;
a conductive epoxy for maintaining a connection of said at least one electrical component to said lead frame substrate; and
a housing for maintaining said lead frame substrate, said at least one electrical component, said plurality of wire bonds, said thermoset plastic and said conductive epoxy, thereby providing a sensor package apparatus for maintaining a speed sensor, said sensor package apparatus comprising said lead frame substrate, said at least one electrical component, and said plurality of wire bonds, while eliminating a need for a Printed Circuit Board (PCB) or a ceramic substrate in place of said lead frame substrate as a part of said sensor package apparatus.

* * * * *